United States Patent [19]
Henry

[11] Patent Number: 4,980,553
[45] Date of Patent: Dec. 25, 1990

[54] RADIOLOGICAL IMAGE DETECTOR

[75] Inventor: Yves Henry, Eybens, France

[73] Assignee: Thomson-CSF, Puteaux, France

[21] Appl. No.: 344,248

[22] Filed: Apr. 27, 1989

[30] Foreign Application Priority Data
May 3, 1988 [FR] France ............... 88 05903

[51] Int. Cl.⁵ .............................. G01T 1/20
[52] U.S. Cl. ................. 250/369; 250/370.09; 250/370.11
[58] Field of Search ............ 250/370.09, 370.11, 250/369; 358/111

[56] References Cited
U.S. PATENT DOCUMENTS
4,797,560 1/1989 Berger et al. ............. 250/578

Primary Examiner—Carolyn E. Fields
Attorney, Agent, or Firm—Roland Plottel

[57] ABSTRACT

A radiological image detector of the type formed by a matrix of photosensitive elements, associated with a light source, enables a resetting of the voltages at the terminals of the photosensitive elements, the light source and the photosensitive matrix being connected to each other so as to give the image detector a particularly small thickness. To this end, the light source includes a stack of semiconducting layers forming at least one electroluminescent diode having, as its support, a substrate of the matrix.

5 Claims, 3 Drawing Sheets

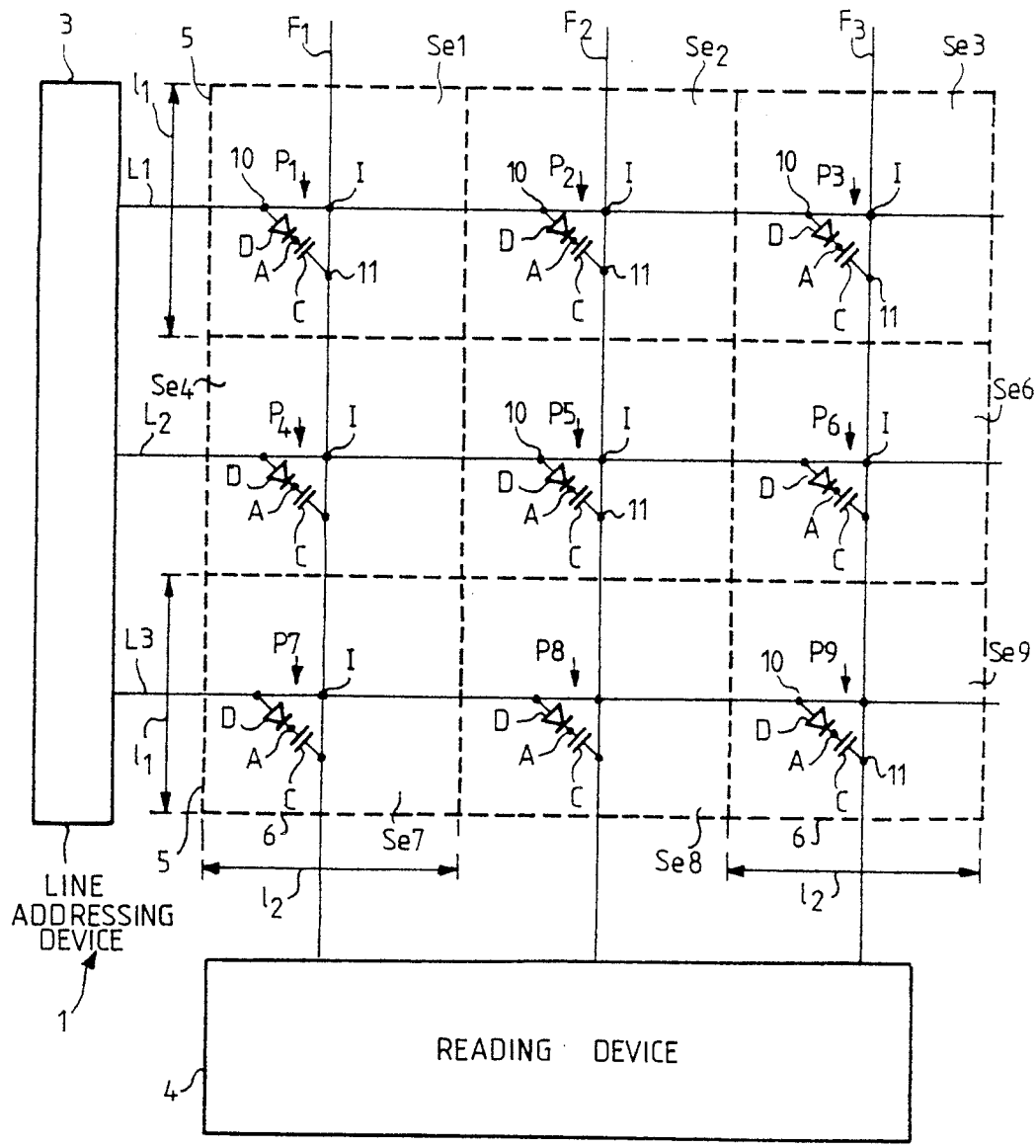

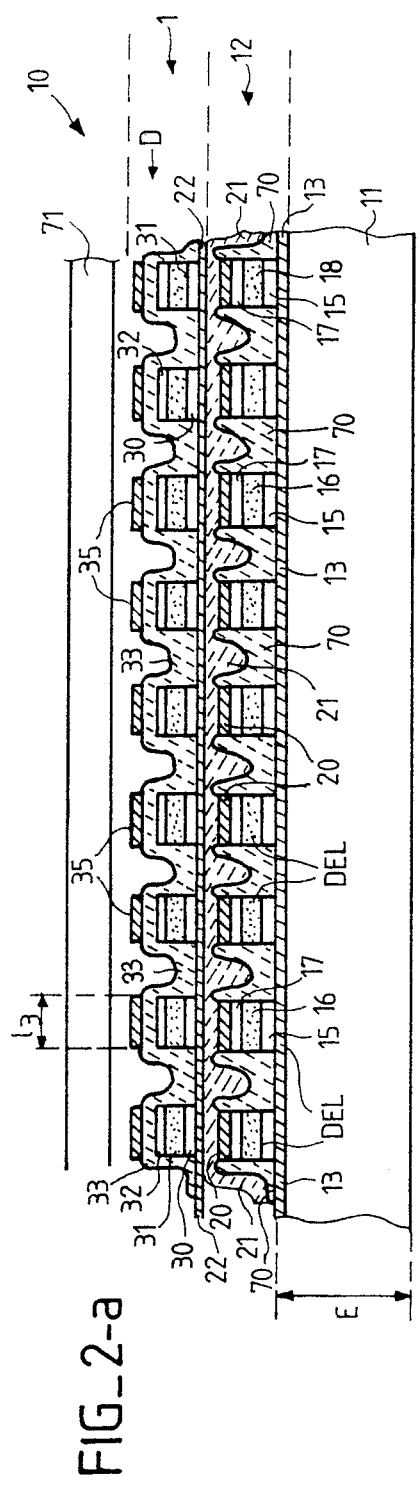
FIG_2-a
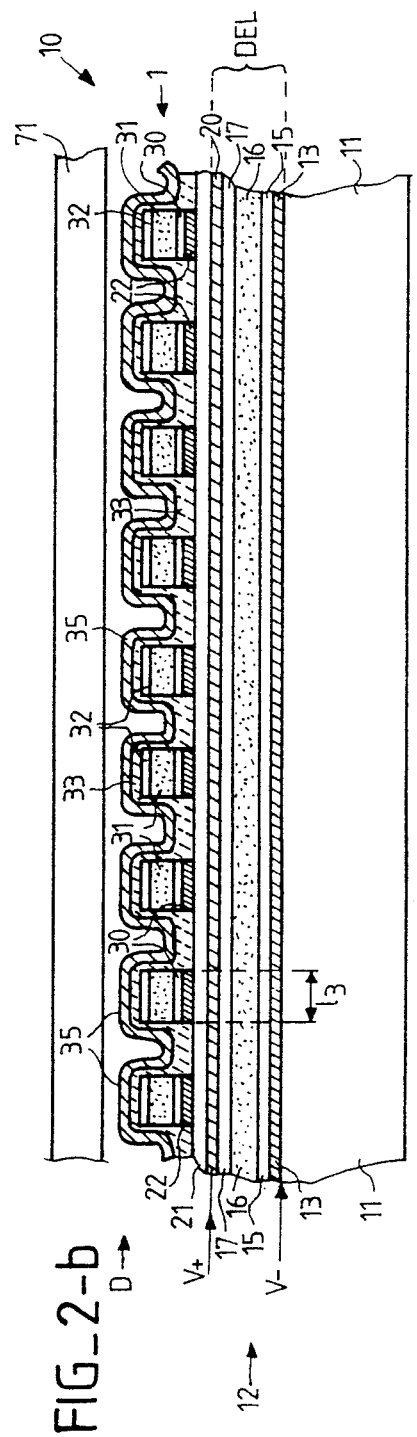
FIG_2-b

FIG_3
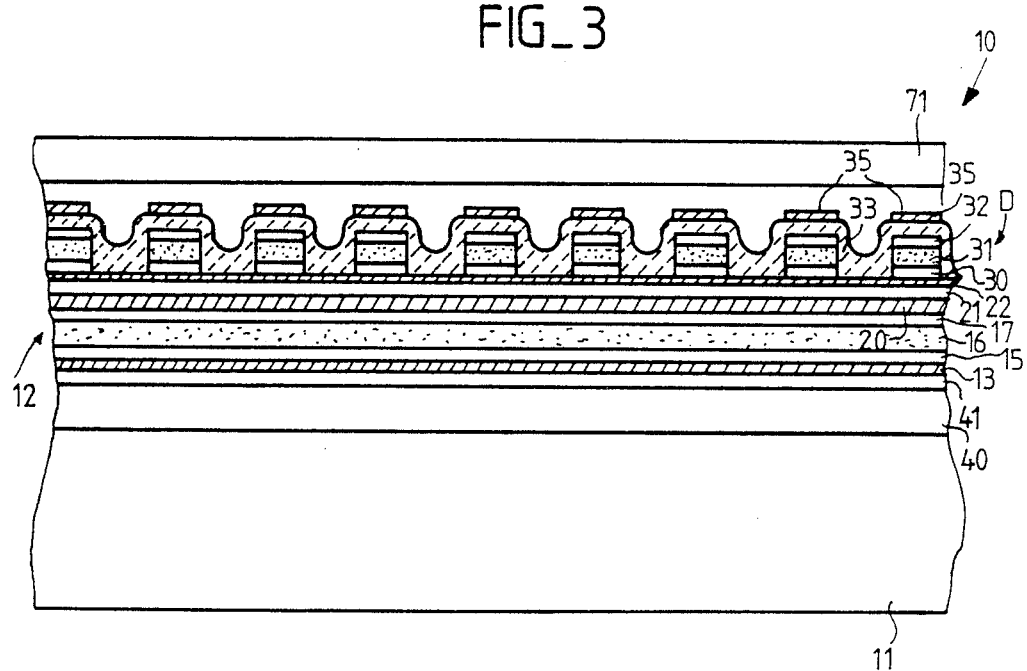
FIG_4
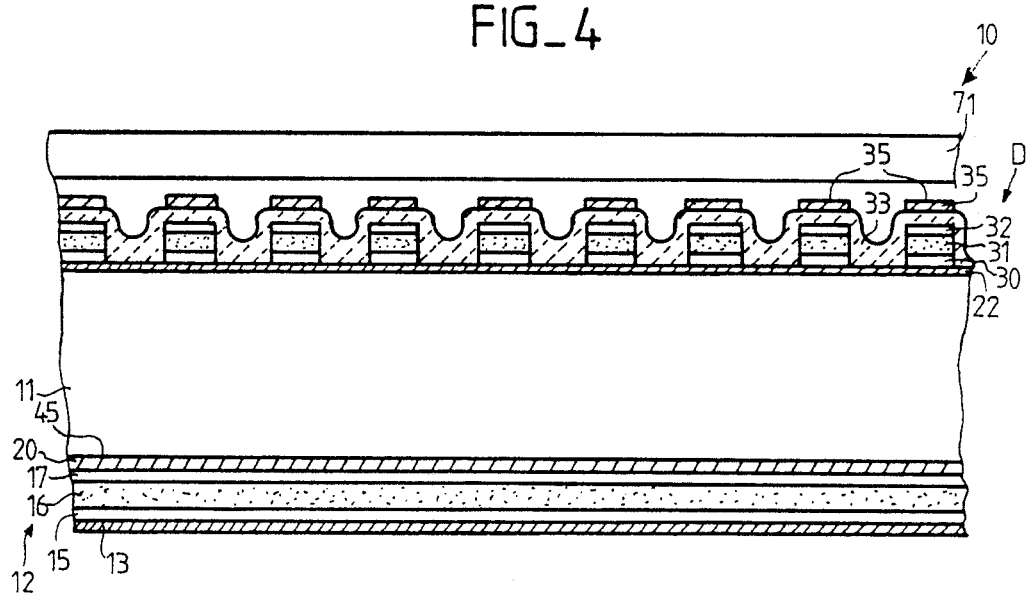

RADIOLOGICAL IMAGE DETECTOR

BACKGROUND OF THE INVENTION

1. Field of the Invention

The invention concerns a radiological image detector of the type having a matrix arrangement of photosensitive elements. It concerns, more particularly, means to produce a light designed to achieve a resetting of the voltages at the terminals of the photosensitive elements.

2. Description of the Prior Art

The techniques used to make thin layer depositions, notably of amorphous silicon, are now properly mastered, and enable the making of large sized (40 cm×40 cm), high-resolution matrices of photosensitive elements which can, therefore, form digital type image detectors that are advantageously applicable to radiology.

In a standard way, photosensitive matrices comprise a network of row conductors and a network of column conductors. At each intersection of a row conductor and a column conductor, there is a photosensitive assembly called a photosensitive dot. The photosensitive dots are thus organized also in rows and columns. Each photosensitive dot is connected between a row conductor and a column conductor. In fact, to each row conductor, there are connected as many photosensitive dots as there are columns of these dots, and to each column conductor, there are connected as many photosensitive dots as there are rows of these dots.

Each photosensitive dot has at least one photosensitive element such as a photodiode, a phototransistor or a photoconductor, sensitive to visible light photons. These light photons are converted into electrical charge and this electrical charge is collected in an electrical capacitor forming a storage capacitor, constituted either by the capacitor of the photosensitive element itself or by an associated ancillary capacitor. A reading device enables the interrogation of the electrical state of the storage capacitor and the conveying of the electrical charge which forms the signal to a signal amplifier.

An example of a photosensitive matrix is given in a French patent No. 86 00656, published under number 2 579 319, which describes the detailed working of a photosensitive matrix as well as the appropriate reading method. Each photosensitive dot of this matrix is formed by a photodiode in series with a capacitor.

Another French patent No. 86 00716, published under the number 2 593 343, pertains to a matrix with a network of photosensitive dots, each formed by a photodiode and a capacitor in series, as mentioned above. This patent describes a method for the manufacture of a photosensitive matrix of this type, as well as a method for reading this matrix and an application of this matrix to the taking of radiological pictures. In order to pick up radiological images, the structure shown has a scintillator panel or screen which is subjected to an X-radiation. In response to this X-radiation, the scintillator screen emits radiation in visible light to which the photosensitive elements are sensitive.

The working of the photosensitive elements as described, for example, in the two above mentioned applications may require a stage for the restoring of the potential at the terminals of the photosensitive elements. This restoring of potential is called a voltage resetting stage (designated as RAN) in the above mentioned patent applications. This optic type of resetting stage can be achieved either by a calibrated uniform illumination, which may be of a given duration or may be permanent, and which produces a signal of little noise that is superimposed on the signal to be read, or by an intense light flash.

To achieve an optic type of resetting such as the one mentioned above, there is a known way to use a network of electroluminescent diodes, available in the market. Each of these electroluminescent diodes, in a standard way, forms an independent element, and these diodes are mounted on a panel so as to form a luminous panel giving a light-emitting surface with substantially the same dimensions as the matrix of photosensitive elements or photosensitive panel. The electroluminescent panel is applied against the photosensitive panel, and this set forms a digitized type of image detector.

A first drawback of this digitized image detector is that it is too thick to be interchangeable with a film cassette currently used in medical radiography instruments. This is due to the excessive thickness of the luminous panel. Another drawback lies in the complexity of the mechanical system for the support and assembly of the luminous panel/photosensitive panel set.

SUMMARY OF THE INVENTION

One of the aims of the present invention is to enable the making of a digitized radiological image detector, of the type having a matrix of photosensitive elements and means designed to achieve an optic type of resetting while, at the same time, remaining compatible, in the sense of having interchangeability, namely as regards dimensions, with standard film-using radiological systems.

According to the present invention, there is proposed a radiological image detector having a substrate, bearing a matrix of photosensitive dots, at least one light source, each photosensitive dot comprising at least one photosensitive element, the light source emitting a light designed to achieve a voltage resetting of the photosensitive elements, a radiological image detector wherein the light source comprises a stack of semiconducting layers deposited between two conducting layers so as to form at least one electroluminescent diode having, as its support, the substrate of the matrix of photosensitive elements.

BRIEF DESCRIPTION OF THE DRAWINGS

Other features and advantages of the present invention will appear from the reading of the following description, given by way of a non-restrictive example, with reference to the appended drawings, of which:

FIG. 1 shows, by way of a non-restrictive example, the electrical diagram of a photosensitive matrix capable of being used in an image detector according to the invention;

FIGS. 2a and 2b are lateral sections along two orthogonal directions, giving a schematic view of a first embodiment of an image detector according to the invention, in which a light source is integrated.

FIG. 3 is a lateral section, similar to that of FIG. 2a, which gives a schematic view of another embodiment of the image detector according to the invention, and illustrates a different position of the light source shown in FIGS. 2a and 2b;

FIG. 4 shows a lateral sectional view which schematically illustrates a third embodiment of the image detector according to the invention.

DETAILED DESCRIPTION OF THE INVENTION

FIG. 1 gives a schematic view of a light sensitive matrix 1, said electrical drawing being itself a standard one. For, the matrix 1 has several photosensitive dots P1, P2, ..., P9 which are arranged in rows and columns. In the non-restrictive example described, the photosensitive dots P1 to P9 are each formed by a photosensitive element D in series with a capacitor C, according to a same assembly as that of the photosensitive dots described in the above mentioned French patents Nos. 86 00656 and 86 00716. Of course, the invention can be applied with other types of photosensitive elements, whenever is necessary to use a light source to restore the voltages at the terminals of the photosensitive elements. In the non-restrictive example described, the number of photosensitive dots P1 to P9 is restricted to nine, in a 3×3 matrix assembly, to simplify FIG. 1, but in the spirit of the invention, this matrix assembly may have a far greater capacity, of several millions of dots for example.

The matrix 1 has row conductors L1 to L3 and column conductors F1 to F3. The number of each type of these conductors is limited to 3, in view of the example of FIG. 1 where only nine photosensitive dots are shown.

In practice, and in a manner that is standard per se the photosensitive dots P1 to P9 are each formed at the intersection I of a row conductor L1 to L3 and a column conductor F1 to F3. Each photosensitive dot P1 to P9 has a first end 10 connected to a row conductor L1 to L3, and has a second end 11 connected to a column conductor F1 to F3. The junction formed between the photosensitive element D and the capacitor C forms a zone A where charges are generated and stored. The quantity of these charges is proportionate to the illumination of the photosensitive element D. In the non-restrictive example described, the photosensitive element D is a photodiode, but it could be of a different type.

In a standard way, the matrix 1 is divided into elementary surfaces Se1, Se2 ..., Se9, each capable of being centered on a center of intersection I, and each having a photosensitive dot P1 to P9. The elementary surfaces Se1 to Se9 have dimensions determined by the pitches of the row and column conductors L1 to L3 and F1 to F3, said pitches being respectively symbolized by a first length and a second length 11 12 of a first and second side 5, 6, of these elementary surfaces Se1 to Se9. If the pitches are the same, the elementary surfaces Se1 to Se9 are square shaped, as in the non-restrictive example described, and in the case of large-capacity matrices (several millions of dots), the length 11, 12, of the side 5, 6, may be of the order of 200 micrometers.

The row conductors L1 to L3 are connected to a row addressing device 3 and the column conductors F1 to F3 are connected to a reading and multiplexing device 4, so as to implement either of the methods taught in the French patent applications Nos. 86 00656 and 86 00716 in order, initially, to enable the creation and storage of charges or items of information at the different dots A and then, to enable the reading and acquisition of these items of information. It will be recalled that, for each photosensitive dot P1 to P9, the main stages of the operation are the following:

(1) stage of reverse bias of the diode;
(2) stage of illumination of the photodiode (following, for example, a flash of an X-radiation for the irradiation of a patient, and conversion of the X-radiation into a radiation of visible or near visible wavelength); storage of the information corresponding to the illumination;
(3) reading stage (forward bias of the photodiode);
(4) stage for resetting of the voltages at the terminals of the photodiode, obtained either by means of a calibrated uniform illumination or by means of an intense light flash (namely by means of a light source).

FIGS. 2a and 2b are lateral sections along two orthogonal directions, which give a schematic view, as a non-restrictive example, of a first embodiment of a structure of an image detector 10 according to the invention.

The image detector 10 has a matrix 1 of photosensitive dots of the type shown in FIG. 1 for example, said matrix being borne by a substrate 11.

According to one characteristic of the invention, the detector 11 has at least one light source 12 integrated in the structure, namely having, as its support, the same substrate 11 as the matrix 1.

In the non-restrictive example of this first version of the invention, the light source 12 is placed between the matrix 1 of photosensitive dots and the substrate 11. Thus, the substrate 11 may, in this case, be made of any material compatible with the function of the substrate; it may or may not be opaque to the light emitted by the light source 12: thus, the substrate 11 may be made of glass and may be transparent, but it may also be opaque and metallic, made of stainless steel for example. In the latter case, it would enable its thickness E to be reduced.

In the non-restrictive example of the description, the light source 12 is formed through a stacking of three semiconducting layers 15, 16, 17, placed between a lower electrically conductive layer 13, and an upper electrically conductive layer 20. This set is designed to form one or more electroluminescent diodes, DEL the number of electroluminescent diodes DEL depending on a possible etching, standard in itself, of these layers. In the non-restrictive example described, the lower conducting layer 13 is formed, for example, by an indium-tin oxide (ITO), and it may be etched so as to obtain a network of column electrodes 13. On the lower conductive layer or column electrode 13, the stack of the three semiconducting layers 15, 16, 17, is then deposited forming, for example, a NIP type structure, designed to constitute the above mentioned matrix of electroluminescent diodes DEL. The working principle of this NIP type structure is known from an article by Yoshihito Hamakawa et al. published in the Japanese Journal of Applied Physics, Vol. 24, No. 10, October 1985, page 806, and is also known from the MRS Meeting, Los Angeles, 22–24 Apr., 1987.

As stated above, the electroluminescent diode or diodes are formed by three layers of superimposed semiconducting layers 15, 16, 17, forming a NIP structure made of amorphous silicon carbide SiC, made by a method of chemical decomposition under gas phase (chemical vapor deposition or CVD) activated by a plasma: the first layer 15 is a layer of hydrogenated amorphous silicon carbide doped with an N-type impurity, phosphorous for example. This first layer 15 is obtained with a concentration of active gas such as, for example:

$$CH_4/(SiH_4+CH_4)=0.25.$$

The second layer 16 is a layer of intrinsic hydrogenated amorphous silicon carbide obtained with a concentration of active gas such as, for example:

$$CH_4/(SiH_4+CH_4)=0.5.$$

The third layer 17 is a layer of hydrogenated amorphous silicon carbide doped with a P-type impurity, boron for example. This third layer is obtained with a concentration of active gas such as, for example:

$$CH_4/(SiH_4+CH_4)=0.25.$$

These three layers 15, 16, 17 may then be photo-etched so as to leave, for example, a series of squares or islands designed to form the electroluminescent diodes DEL, and forming a matrix, the elements of which are aligned on the columns 13. In the case of an etching such as this, a transparent insulating layer 70, made of silicon nitride, for example, is then deposited on these layers 15, 16, 17, as shown in FIG. 2a. Apertures are made in this insulating layer 70 above the third semiconducting layer 17 so as to put the electroluminescent diodes DEL in contact with the upper conducting layer 20. Then, the transparent upper conducting layer 20 formed, for example, by an indium-tin oxide (ITO) is deposited. This conducting upper layer 20 may be etched so as to form a network of row electrodes or conductors perpendicular to the column electrodes or conductors 13. It must be noted that it is possible to give the electroluminescent diodes DEL shapes of bands parallel to the row electrodes 20. In this case, the three semiconducting layers 15, 16, 17, are etched at the same time as the row electrodes 20, formed by the upper conducting layer 20, and the latter is deposited directly on the layer 17, as shown in FIG. 2b, without its being necessary to deposit the insulating layer 70 and without its being necessary, as the case may be, to etch the lower conducting layer 13.

The unit is then coated with an insulating layer 21, which is transparent to light, made of polyimide resin, for example, having a thickness of some micrometers such as, for example, the product marketed by the firm DUPONT de NEMOURS under the reference Pi2555.

With the light source 12 having been thus made, the matrix 1, formed in a manner known per se, as explained below, is then found above this light source: a layer 22 of an electrically conductive material is deposited on the insulating layer 21. This electrically conductive layer 22 is formed, for example, by indium-tin oxide (ITO) and it is etched so as to form a number n of column conductors F1, F2, F3, ..., Fn. We then find the photosensitive elements D, each photosensitive element being formed, for example, by a PIN diode (PN junction with intrinsic central part). The diodes D are formed by the deposition of three successive layers 30, 31, 32: the first layer 30 is a layer of hydrogenated amorphous silicon doped with a P-type impurity, boron for example. The following layer 31 is a layer of intrinsic hydrogenated amorphous silicon. Finally, the third layer 32 is a layer of hydrogenated amorphous silicon doped with an N-type impurity, phosphorous for example. These latter three layers 30, 31, 32, are etched in a pattern of islands, so as to form the photosensitive elements or diodes D. These islands have, for example, a square shape, the sides of which have the same dimension as a width 13 of the column conductors F1, F2, F3, Fn, this width 13 of the column conductors itself being, in the non-restrictive example described, slightly smaller than the dimension 11 of one side of an elementary surface Se1 to Se9 (shown in FIG. 1). Above this third layer 32 belonging to the photodiodes D, here is an insulating layer 33 designed to form the dielectric of the capacitors C (shown in FIG. 1) which are in series with the photosensitive elements D. The dielectric layer 33 is is transparent and formed, for example, of silicon nitride.

The dielectric layer 33 is coated with an upper conductive layer 35 which is also transparent, (made of indium-tin oxide) and etched to form a number n' of row conductors L2, L3, ..., Ln'. These row conductors have the same width as the column conductors F1 to Fn.

Above the upper conductive layer 35 from which the row conductors L1, L2, L3, Ln' are formed, there is placed a layer 71 of a scintillating substance, made of gadolinium oxysulphide for example, which emits a visible light in response to an incident X-radiation. The scintillating layer 71 may be formed, for example, by a gadolinium oxysulphide powder buried in a thermo-hardening resin, so as to form a sheet, said sheet having a thickness ranging between 100 and 400 micrometers, and capable of being, for example, bonded or pressed to the upper surface of the matrix 1 opposite the substrate 11.

In the non-restrictive example described, the etching of the light source 12 is such that several electroluminescent diodes DEL are made so that each forms an electroluminescent band, and these bands are indexed on the rows of photodiodes D, i.e. parallel to the width 13 of the row conductors L1 to L3, they have substantially one and the same width as the latter. These electroluminescent bands DEL have a length (partially visible in FIG. 2b) which is substantially equal to the length of the rows formed by the photodiodes D. Thus, for an image detector 10, forming a 20 cm×20 cm panel, these electroluminescent bands DEL have a length of 20 cm (corresponding to 1000 photosensitive diodes D) and a width of 200 micrometers (corresponding to one photodiode D). It is then possible to make the light source 12 work in order to achieve a row-by-row resetting of the photodides D, in applying the voltages needed for the operation of the electroluminescent diodes DEL by the row electrodes 20 of the light source 12, in the desired order, using means (not shown) which are standard per se. In this case, the light source 12 would have a matrix of 1000 electroluminescent bands DEL.

Naturally, other areas of electroluminescent diodes DEL can be used, ranging from the elementary diode DEL, having a same dimension as a photodiode D, to electroluminescent diodes DEL with an area of several $cm^2$, enabling for example, a row-by-row scan operation, as explained above, or having a surface with a different shape. The possibilities also include the making and use of a single electroluminescent diode DEL with a total area equal to that of the detector panel (for example, 20 cm.×20 cm.). The advantage in the latter case is that the number of connections will be reduced, and the etching operation will be avoided. As indicated in the above mentioned articles pertaining to the operation of these electroluminescent diodes DEL, the quantity of light emitted by a electroluminescent diode DEL depends on the current that is injected. In the example of electroluminescent diodes DEL described above, these diodes emit in the red range, but the wavelength may be modified: for example, by increasing the carbon content of the intrinsic layer 16 made of amorphous silicon carbide (i.e.:

$$\frac{CH_4}{SiH_4 + CH_4})$$

the wavelength is reduced.

With electroluminescent diodes DEL according to the invention, the quantity of light emitted which is necessary to achieve the voltage resetting of the photosensitive element D is emitted for a current of the order of 50 mA per cm² of area of the electroluminescent diode DEL, so that a row-by-row scan type operation requires current of the order of 20 mA and a single electroluminescent diode having the total area of the photosensitive panel requires current of the order of 20 amperes, corresponding to power dissipation of 100 watts.

The electroluminescent diodes DEL are powered in forward mode, i.e. the supply voltage of these electroluminescent diodes is applied so that the positive bias V+ is applied to the P doped zones (layer 17) and the negative bias V— is applied to the N doped zones (layer 15), i.e. the positive bias V+ of the supply is applied to the electrically conductive upper layer 20 capable of being etched to form row electrodes and the negative bias V— is applied to the lower conductive layer 13, capable of being etched to form column electrodes. The result thereof is that the light produced by the electroluminescent diodes DEL is emitted by the P doped zone of these diodes, i.e.; through the layer 17, towards the photodiodes D.

FIG. 3 shows the image detector 10 in a view similar to that of FIG. 2a and illustrates a version of the invention wherein the image detector 10 has a scintillator screen 40 placed between the photosensitive matrix 1 and the substrate 11. The image detector 10 may or may not have the upper scintillating layer 71 shown in FIG. 2a, and the simultaneous presence of two scintillator screens may be valuable, notably in the case of a detection of radiological pictures in bi-energy mode.

The lower scintillator 40 may be placed on the substrate 11 by a method such as one that consists, for example, in taking a standard scintillating sheet and bonding it to the substrate 11 with a bonder compatible with the processing temperatures which will be used in the subsequent stages. The sheet is formed, for example, by a thermo-hardening resin, in which a scintillating powder such as gadolinium oxysulphide is buried. The sheet may also be made of an epoxy resin, if the subsequent processing temeratures are low enough. This method applies notably to the case where the deposition method used is of the CVD type, activated by light excitation in the ultra-violet range, and when the temperatures reached do not exceed about 150° C. Of course, if the subsequent processing temperatures are greater than 150° C., the binder used to form the scintillator is inorganic in nature, and the scintillator may be deposited by sedimentation according to a method which is standard per se.

After deposition and processing of the scintillating layer 40, an intermediate insulating layer 41 is deposited. The function of this layer 41 is notably to planarize the upper surface of the layer 40, and to form a barrier to a diffusion of impurities between the scintillating layer 40 and the light source 12. The intermediate insulating layer 41 may be made of polyimide of the above-mentioned type. It is deposited by centrifugation for example, after which it is completely polymerized with an annealing treatment at 150° C. for one hour. Its thickness is about 2 to 10 micrometers. Subsequently on top of this intermediate insulating layer 41, the light source 12 and the photosensitive matrix 1 are made in a same way as in the above example.

It must be noted that, in the non-restrictive example shown in FIG. 3, the light source 12 is illustrated by a single electroluminescent diode DEL, i.e. no etching has been made in the layers 13, 15, 16, 17, 20, which constitute this diode.

FIG. 4 shows the image detector 10 in a view similar to that of FIG. 4, with the difference that, in this version, the light source 12 is formed on the substrate 11, on a face 45 of this substrate opposite the photosensitive matrix 1. In this version of the invention, the substrate 1 is obligatorily transparent, being made of glass for example. The photosensitive matrix 1 is formed in the same way as in the above examples, but directly on the substrate 11.

The light source 12 has, as in the above examples, two electrically conductive layers 13, 20, between which are deposited the semiconducting layers 15, 16, 17, so as to form at least one electroluminescent diode DEL. To this effect, there is deposited, on the face 45 of the substrate 11, the electrically conductive layer 20 referred to above as being capable of being etched to form column electrodes. Then, on this etched or unetched electrically conductive layer 20, there is deposited the layer 17 made of hydrogenated amorphous silicon carbide doped with a P type impurity. Then, on this P doped layer 17, the layer 16, made of intrinsic amorphous silicon carbide, is deposited. Then, on this layer 16, forming the intrinsic zone, there is deposited the layer 15 made of hydrogenated amorphous silicon carbide doped with an N type impurity. Then, the electrically conductive layer 13, mentioned earlier as being capable of being etched to form column electrodes, is deposited. In this case, it is advantageous to make this conductive layer 13 with a metal, tungsten or molybdenum, for example, so that this conductive layer 13 further forms a reflector enabling losses of light to be avoided.

As in the above examples, the light source 12 may be formed by a single electroluminescent diode DEL or else, through etching operations, it may be formed by several electroluminescent diodes, the current supply being provided in the same way as in the preceding examples.

It must be noted that the light source 12 could also be integrated into the structure, but in being placed on the other side of the photosensitive matrix 1, opposite the substrate 11, i.e. on the side where there is the N doped layer 32 of the photosensitive matrix 1. In this latter case (not shown) the electroluminescent diode or diodes, which would form the light source 12, would have to be made with a PIN type structure so that the light emission is oriented towards the photosensitive elements D.

What is claimed is:

1. A radiological image detector comprising a matrix of photosensitive dots formed on a substrate, at least one light source, a scintillator, the photosensitive dots each comprising at least one photosensitive element, the at least one light source producing a light designed to achieve a voltage resetting of the photosensitive elements, wherein the at least one light source comprises a stack of semiconducting layers formed between two conducting layers so as to constitute at least one electroluminescent diode having, as its substrate, the substrate of the matrix of photosensitive elements, and wherein the at least one light source is placed between the substrate and the photosensitive matrix.

2. A radiological image detector according to claim 1, wherein the substrate is opaque to the light emitted by the at least one light source.

3. A radiological image detector according to claim 1, wherein the substrate is metallic.

4. A radiological image detector according to claim 1, said scintillator comprising a scintillator screen interposed between the substrate and the at least one light source, the at least one light source being insulated from the scintillator screen by an insulating layer made of polyimide.

5. A radiological image detector according to claim 1, wherein the at least one light source is insulated from the photosensitive elements by an insulating layer made of polyimide.

* * * * *